(12) United States Patent
Nogawa

(10) Patent No.: US 6,669,076 B2
(45) Date of Patent: Dec. 30, 2003

(54) WIRE BONDING DEVICE

(75) Inventor: Jun Nogawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 107 days.

(21) Appl. No.: 10/086,040

(22) Filed: Feb. 27, 2002

(65) Prior Publication Data

US 2002/0104870 A1 Aug. 8, 2002

(30) Foreign Application Priority Data

Mar. 2, 2001 (JP) ........................................ 2001/057908

(51) Int. Cl.[7] ........................ B23K 37/00; B23K 13/08; B23K 15/02
(52) U.S. Cl. ............................... 228/4.5; 228/8; 228/12
(58) Field of Search ............................. 228/4.5, 4.1, 8, 228/9, 12, 102, 180.5; 217/85.18

(56) References Cited

U.S. PATENT DOCUMENTS

| | | | | |
|---|---|---|---|---|
| 4,795,518 A | * | 1/1989 | Meinel et al. | 156/285 |
| 5,816,477 A | * | 10/1998 | Shimizu | 228/102 |
| 6,449,516 B1 | * | 9/2002 | Kyomasu et al. | 700/58 |
| 6,542,783 B2 | * | 4/2003 | Takahashi et al. | 700/58 |

FOREIGN PATENT DOCUMENTS

| | | | |
|---|---|---|---|
| JP | 1-161727 | | 6/1989 |
| JP | 404255242 A | * | 10/1992 |
| JP | 10041354010 A | * | 2/1998 |

* cited by examiner

*Primary Examiner*—Kiley Stoner
*Assistant Examiner*—Colleen P. Cooke
(74) *Attorney, Agent, or Firm*—Scully, Scott, Murphy & Presser

(57) ABSTRACT

A wire bonding device in accordance with the present invention is provided, which comprises: an XY table (2), a first holding member (8) supported by the XY table (2), a camera (9) supported by the first holding member (8), a second holding member (5) supported by the XY table (2), a capillary (7) held by the second holding member (5), a stationary base (3) for securing an object of bonding (4) in position, and a driving amount calculating unit (13) for computing the driving amount of the XY table (2) on the basis of the positional deviation of the camera (9) with respect to the origin of the XY table (2) due to temperature change in the first holding member (8) and the positional deviation of the capillary (7) with respect to the origin of the XY table (2) due to temperature change in the second holding member (5).

6 Claims, 4 Drawing Sheets

WIRE BONDING DEVICE

BACKGROUND OF THE INVENTION

1. Field of the Invention

The present invention relates to a wire bonding device, in particular, to a wire bonding device in which relative positional deviation of a capillary with respect to an object of bonding is caused by changes in temperature.

2. Description of the Related Art

To assemble a semiconductor device, wiring is automatically performed on an electrode pad of a semiconductor substrate. For such wiring, an automatic bonding device is used. An automatic bonding device is equipped with a horn device for applying an ultrasonic wave to a bonding line paid out from the capillary. A bonding target point of a semiconductor device is monitored by a camera. Such an automatic bonding device is disclosed in Japanese Patent Application Laid-open No. Hei 01-161727. In such a well-known device, there are provided, in order to perform bonding positioning with high accuracy, a temperature detection means for detecting a temperature of a horn, and a correction means for obtaining a change in a length of the horn due to thermal expansion based upon a detection result of the temperature detection means to correct a previously set relative distance between a capillary and a camera.

When coefficients of thermal expansion and dimensions of the support means for securing the camera in position and the horn and the relative positional deviation between the camera and the capillary from the initially set state due to changes in temperature are not taken into account, it is impossible to eliminate the positional deviation factors due to thermal expansion of the mechanism parts as a result of temperature change, and further, it is impossible to correct the deviation of the reference bonding position of the semiconductor device which is the object of bonding. The above-mentioned well-known technique does not teach any correction means for correcting thermal expansion of the support means for securing the camera in position, nor does it suggest the importance of such correction. Further, the thermal deformation of the object of bonding is not taken into account at all.

It is required that the absolute positional deviation of the camera should be taken into account and that the positional relationship between the camera and the horn should be corrected. For a future semiconductor device, there is also a requirement for a further improvement in the accuracy of the bonding position, which is to be attained by taking into account the thermal expansion/contraction of the object of bonding.

SUMMARY OF THE INVENTION

It is an object of the present invention to provide a wire bonding device in which the absolute positional deviation of the camera is taken into account and in which the positional relationship between the camera and the horn is corrected.

In accordance with the present invention, there is provided a wire bonding device comprising: an XY table (2), a first holding member (8) supported by the XY table (2), a camera (9) supported by the first holding member (8), a second holding member (5) supported by the XY table (2), a capillary (7) held by the second holding member (5), a stationary base (3) for securing an object of bonding (4) in position, and a driving amount calculating unit (13) for computing the driving amount of the XY table (2) on the basis of the positional deviation of the camera (9) with respect to the origin of the XY table (2) due to temperature change in the first holding member (8) and the positional deviation of the capillary (7) with respect to the origin of the XY table (2) due to temperature change in the second holding member (5).

In a coordinate system in which the camera (9) and the capillary (7) are caused to move integrally by the XY table (2), the first holding member (8) and the second holding member (5) undergo thermal deformation independently, with the result that a minute deviation is caused in the positional relationship between the camera (9) and the capillary (7), and this minute deviation is calculated, correcting the position of the object of bonding (4) detected and calculated through imaging of the camera (9). On the basis of the positional deviation of the capillary (7) held by the second holding member (5), the moving amount of the XY table (2) is corrected, whereby the deviation of the bonding position due to thermal fluctuations is eliminated, making it possible to realize a bonding of high positional accuracy. The relative positional deviation between the camera (9) and the capillary (7) due to thermal fluctuations can be physically calculated by detecting the temperatures of the holding member (8) supporting the camera (9) and the support member (5) supporting the capillary (7).

There is further added an expansion coefficient calculating unit for calculating the expansion coefficient of the object of bonding (4). In this case, the driving amount calculating unit (13) performs calculation by adding the positional deviation of the bonding point of the object of bonding (4) with respect to the stationary base (3) on the basis of the expansion coefficient, to both of the above-described positional deviations. By adding the positional deviation of the bonding (object) point due to the expansion of the object of bonding (4) to both of the above-described positional deviations, it is possible to perform bonding position control with higher accuracy.

The expansion coefficient can be calculated on the basis of a reference distance (L) between two points (24-1 and 24-2, or 25-1 and 25-2) of the object of bonding (4) and the present distance (L+ΔL) between the two points at the present time (24'-1 and 24'-2, or 25'-1 and 25'-2). When the temperature is known, it is possible to calculate the positional deviation of a local point of the object of bonding on the basis of the known expansion coefficient of the object of bonding. Direct measurement of the expansion/contraction of the distance between the reference points of the object of bonding by the camera (9) makes the detection of the positional deviation amount more accurate.

It is possible to further provide a temperature detector (18) for detecting the temperature of the second holding member (5). In this case, the driving amount calculating unit (13) calculates the positional deviation of the capillary (7) based on the temperature. It is possible to provide a first temperature detector (16) for detecting a first temperature of the first holding member (8) and a second temperature detector (18) for detecting a second temperature of the second holding member (5). In this case, the driving amount calculating unit (13) calculates the positional deviation of the camera (9) on the basis of the first temperature, and calculates the positional deviation of the capillary (7) on the basis of the second temperature. In this case also, the expansion coefficient of the above-mentioned object of bonding (4) is taken into account.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
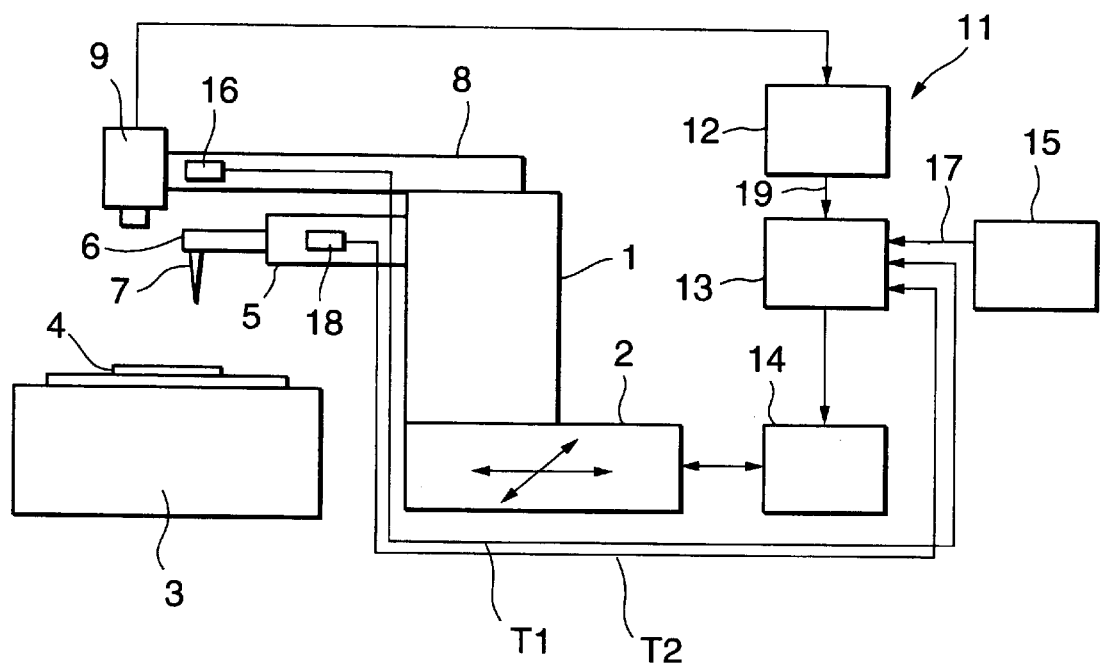
FIG. 1 is a front view of a wire bonding device according to an embodiment of the present invention with a circuit block.

In a wire bonding device according to an embodiment of the present invention, a camera is provided on a bonding head together with an ultrasonic horn. As shown in FIG. 1, the bonding head 1 is secured to an XY table 2 which is movable in a two-dimensional plane. A bonding device base 3 is arranged opposite to the bonding head 1. An object of bonding 4 is positioned on the surface of the bonding device base 3.

A bonding arm 5 is fastened to the bonding head 1 and extends therefrom, and a capillary 7 is supported by the bonding arm 5 through the intermediation of an ultrasonic horn 6. The capillary 7 is opposed to the object of bonding 4 and is supported by the lower side of the forward end portion of the ultrasonic horn 6. The ultrasonic horn 6 applies an ultrasonic wave to the capillary 7 in order to perform bonding on the object of bonding 4 at a predetermined position of the object of bonding 4 while guiding wire thereto.

A camera 9 is supported by a camera arm 8 secured to a bonding headland extending therefrom. The camera 9 is composed of an imaging objective lens and a CCD forming an imaging surface. The XY table 2 is equipped with an electronic control system 11. The electronic control system 11 is composed of an image processing unit 12, a computation processing unit 13, and a control unit 14. A memory 15 is connected to the computation processing unit 13. The image processing unit 12 is connected to the computation processing unit 13, which is connected to the control unit 14.

Thermal expansion of the camera arm 8, which is the camera fixing portion for securing the camera in position, causes positional deviation with respect to the origin of the XY table 2. The positional deviation causes a field-of-view deviation of the camera 9. The memory 15 stores conversion data 17 corresponding to a camera side stationary portion temperature T1 detected by a first temperature sensor 16 mounted to the camera arm 8, and outputs the conversion data 17 to the computation processing unit 13. A second temperature sensor 18 is mounted to the ultrasonic horn 6. The second temperature sensor 18 detects an ultrasonic horn side stationary portion temperature T2. The camera side stationary portion temperature T1 is input to the computation processing unit 13 together with the ultrasonic horn side stationary portion temperature T2.

The image processing unit 12 converts an image taken by the camera 9 to two-dimensional coordinate data 19, and outputs the two-dimensional coordinate data 19 to the computation processing unit 13. The computation processing unit 13 corrects the two-dimensional coordinate data 19 by the amount of field-of-view deviation of the camera 9 by using the conversion data 17 on the basis of the camera side stationary portion temperature T1.

The computation processing unit 13 performs a correction computation in which conversion to a change in the length of the ultrasonic horn 6 due to thermal expansion thereof is effected to correct the position to which the XY table 2 is moved at the time of bonding, and a computation processing in which thermal expansion of each bonding reference coordinate point stored in the memory 15 is corrected from the deviation of the coordinate origin and the ratio of the distance between target points with respect to the reference length on the basis of the target point positions recognized by the camera 9 at least two points of the semiconductor device and the lead constituting the object of bonding 4, and transmits the driving data of the XY table 2 to the control unit 14.

Figure 2:
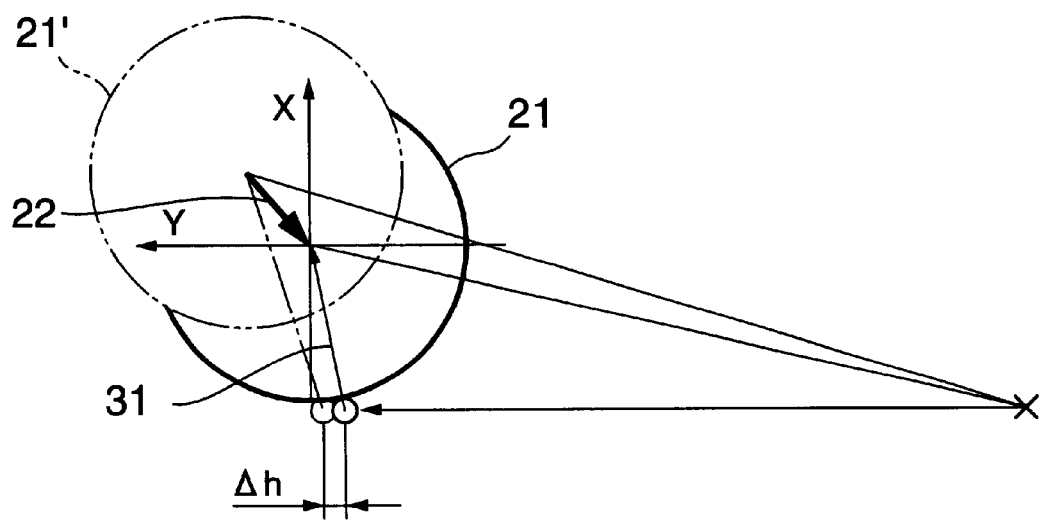
FIG. 2 is a geometrical diagram showing a deviation of the field of view of a camera.
Figure 2:
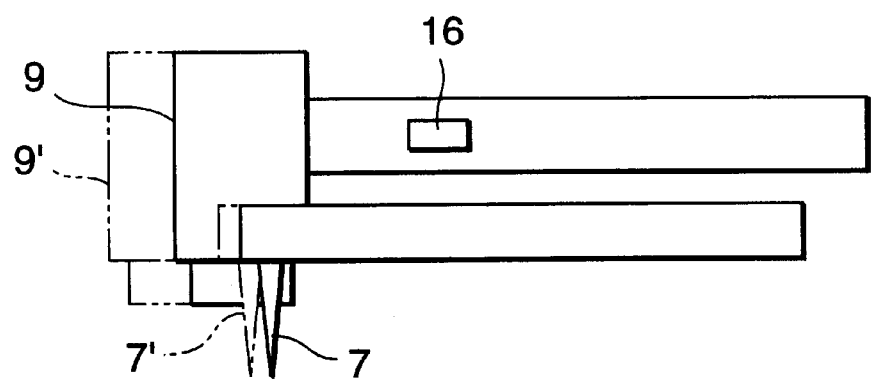

FIG. 2 shows a positional deviation of the field of view of the camera. A programmable coordinate system is set in the image processing unit 12. The field of view 21 indicated by the solid line is a camera field of view in a mechanical coordinate system which is an initial coordinate system (hereinafter referred to as the reference coordinate system) set in the programmable coordinate system with respect to a prescribed temperature. The field of view 21' indicated by the dotted line is the camera field of view when the temperature is fluctuated from the prescribed temperature and the mechanical system expands or contracts to cause a fluctuation in the camera field of view. When thermal expansion occurs in the camera arm 8, the camera field of view 211 of the camera 9 is deviated to the position indicated by the dotted line and moves in the reference coordinate system. The moving amount is indicated by a positional deviation vector 22. Such positional deviation vector 22 can also be obtained through calculation based on the conversion data 17 stored in the memory 15 in correspondence with the detection temperature detected by the temperature sensor 16.

Figure 3:
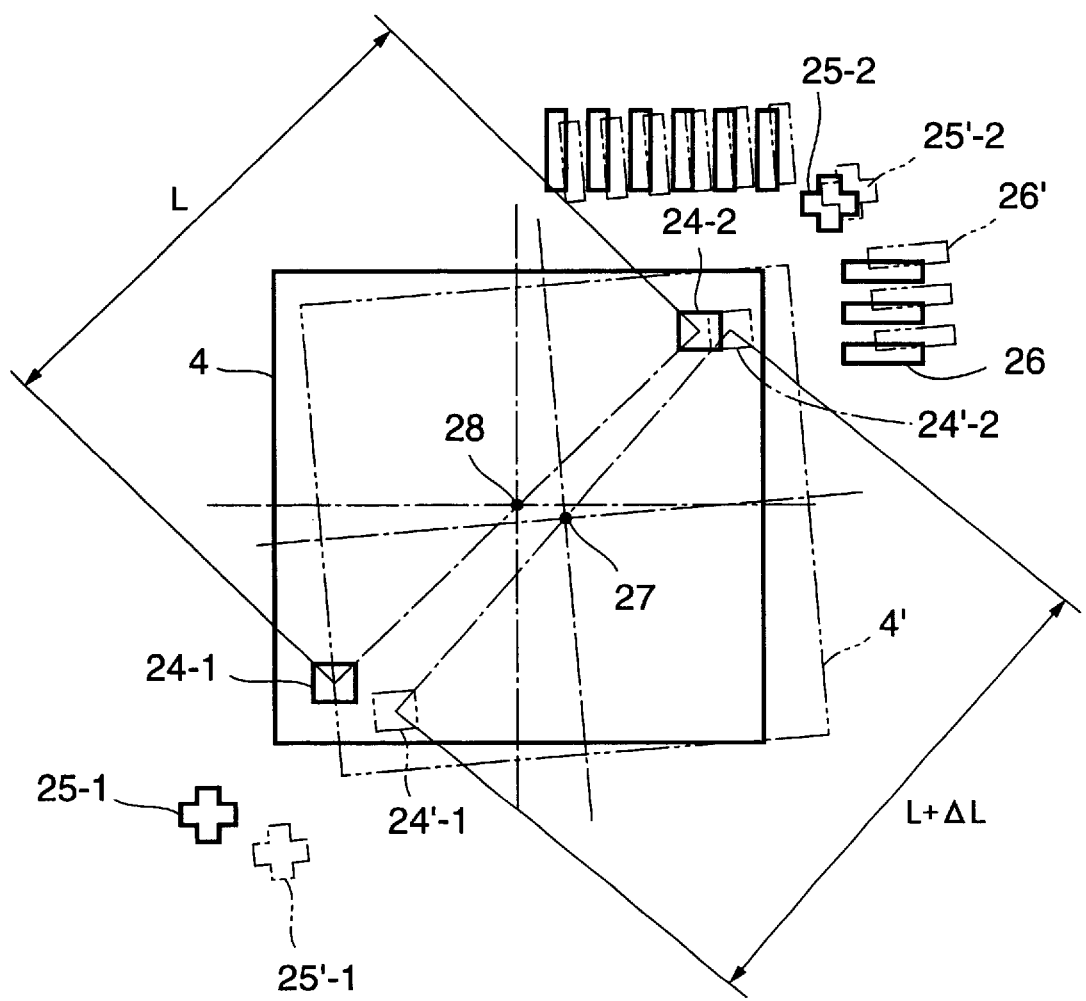
FIG. 3 is a geometrical diagram showing the correction of a coordinate system.

FIG. 3 shows a real image of an object of bonding (e.g., semiconductor device) imaged by the camera 9. The solid line indicates a virtual image of the semiconductor device 4 and the semiconductor wiring substrate which are at reference positions as determined in the reference coordinate system. The dotted line indicates an actual real image of a semiconductor device 4' and a semiconductor wiring substrate shown in a thermally expanded state in which the semiconductor device is mounted at a position deviated including a rotation component with respect to the semiconductor wiring substrate in the die bonding process. As described above, there is a positional deviation as indicated by a positional deviation vector 22 between the target points 24'-1 and 24'-2 of the actual real image 4' of the semiconductor substrate device obtained through processing by the image processing unit 12 and the actual recognition result (real image position) that are the target points 25'-1 and 25'-2 of the actual real image 26' of the bonding lead obtained through processing by the image processing unit 12.

The computation processing unit 13 corrects the bonding coordinate origin 27 calculated as the middle point of the target points 24'-1 and 24'-2 of the actual real image 4' of the semiconductor device based on the positional deviation vector 22, and compares the distance L+ΔL between the target points 24'-1 and 24'-2 of the actual real image 4' of the semiconductor device with the reference distance L to calculate the coefficient of thermal expansion (L+ΔL)/L of the semiconductor device. In the corrected coordinate system determined by the corrected bonding coordinate origin, the positional coordinates of the electrode pad of the semiconductor device are corrected through calculation on the basis of the coefficient of thermal expansion (L+ΔL)/L. Further, the computation processing unit 13 calculates the change in the length of the ultrasonic horn 6 due to thermal expansion on the basis of the temperature detection result of the second temperature sensor 18 mounted to the ultrasonic horn 6.

In the coordinate system thus corrected, the bonding correction position based on the expansion/contraction of the semiconductor substrate constituting the object of bonding 4 is obtained, and such a bonding correction position is output from the computation processing unit 13 and input to the control unit 14. The XY table 2 moves based on such a bonding correction position, and the capillary 7 is moved to an appropriate relative position with respect to the object of bonding 4.

Figure 4:
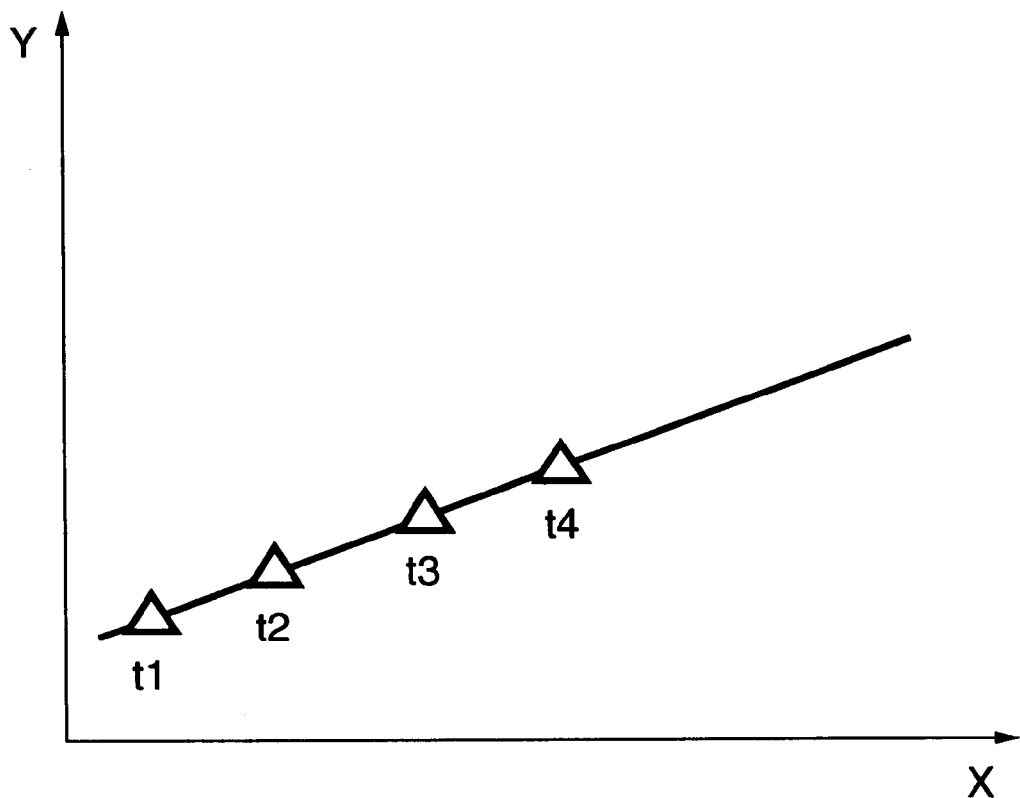
FIG. 4 is a graph showing a linearity of coordinates.

FIG. 4 shows the positional relationship of the two-dimensional coordinates of the camera or the field of view of the camera (camera optical axis) based on temperature change. While the temperature detected by the first temperature sensor 16 changes from t1 to t4, the two-dimensional coordinates (X, Y) of the real image 4' corresponding to the two-dimensional coordinate positions of the field of view of the camera actually has a linear relationship in correspondence with the change.

While in the above-described embodiment the camera mount temperature is detected and converted to a thermal expansion amount to calculate the positional deviation amount of the camera or the objective lens, it is also possible to set an object of comparative recognition which is free from heat influence in the movable range of the XY table, and to image the object of comparative recognition by the camera, whereby the relative deviation amount generated by thermal expansion of the camera holding member is calculated backwards based upon the deviation of an image of the object of comparative recognition obtained through processing by the image processing unit, and the operation of correcting the previously stored information on the positional relationship between the camera and the capillary is automatically executed before the bonding of each semiconductor device. By thus preparing the control program, it is possible to correct the recognition positional deviation due to camera mount thermal expansion at an interval and timing that allows arbitrary change in setting. In this case, there is no need to provide the first temperature sensor 16.

Thus, when recognizing at least two target points of each semiconductor device, the recognition positional deviation due to thermal expansion of the camera holding member is eliminated, and the XY table is driven for bonding after correcting the horn thermal expansion amount to the bonding position calculated through correction of the thermal expansion of the bonding coordinate points from the deviation of the coordinate origin from the reference position and the ratio of the distance between the target points to the reference length, so that it is possible to eliminate the factors of the bonding position deviation caused by thermal deformation (expansion/contraction) of the semiconductor device, horn, and recognition system, making it possible to improve the absolute positional accuracy of the bonding point. As compared with the conventional wire bonding device having no means for correcting the thermal expansion of the semiconductor device and the mechanism parts, it is possible to effect a stable bonding on an electrode pad of the same size and pitch with a greater crimping ball, and to secure a fixed distance between adjacent wirings, so that it is possible to achieve an improvement in terms of yield and reliability for a semiconductor integrated circuit device, in particular, small pad pitch bonding (50 $\mu$m or less in a single row).

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A wire bonding device comprising:
    an XY table;
    a first holding member supported by said XY table;
    a camera supported by said first holding member;
    a second holding member supported by said XY table;
    a capillary held by said second holding member;
    a stationary base for securing an object of bonding in position; and
    a driving amount calculating unit for computing the driving amount of said XY table on the basis of the positional deviation of said camera with respect to the origin of said XY table due to temperature change in said first holding member and the positional deviation of said capillary with respect to the origin of said XY table due to temperature change in said second holding member.

2. A wire bonding device according to claim 1, further comprising an expansion coefficient calculating unit for calculating the expansion coefficient of the object of bonding,
    wherein said driving amount calculating unit performs calculation by adding the positional deviation of the bonding point of the object of bonding with respect to said stationary base on the basis of the expansion coefficient, to the positional deviation of said camera and the positional deviation of said capillary.

3. A wire bonding device according to claim 2, wherein the expansion coefficient is calculated on the basis of a reference distance between two points of the object of bonding and the present distance between the two points at the present time.

4. A wire bonding device according to claim 1, further comprising a temperature detector for detecting the temperature of said second holding member,
    wherein said driving amount calculating unit calculates the positional deviation of said capillary based on the temperature.

5. A wire bonding device according to claim 1, further comprising:
    a first temperature detector for detecting a first temperature of said first holding member; and
    a second temperature detector for detecting a second temperature of said second holding member,
    wherein said driving amount calculating unit calculates the positional deviation of said camera on the basis of the first temperature, and calculates the positional deviation of said capillary on the basis of the second temperature.

6. A wire bonding device according to claim 5, further comprising an expansion coefficient calculating unit for calculating the expansion coefficient of the object of bonding,
    wherein said driving amount calculating unit performs calculation by adding the positional deviation of the bonding point of the object of bonding with respect to said stationary base on the basis of the expansion coefficient, to the positional deviation of said camera and the positional deviation of said capillary.

* * * * *